United States Patent
Welp et al.

(10) Patent No.: US 9,543,496 B2
(45) Date of Patent: Jan. 10, 2017

(54) CREATION OF HIGH-PINNING MICROSTRUCTURES IN POST PRODUCTION YBCO COATED CONDUCTORS

(71) Applicant: UChicago Argonne, LLC, Argonne, IL (US)

(72) Inventors: Ulrich Welp, Lisle, IL (US); Dean J. Miller, Darien, IL (US); Wai-Kwong Kwok, Downers Grove, IL (US); Martin W. Rupich, Framingham, MA (US); Steven Fleshler, Brookline, MA (US); Alexis P. Malozemoff, Lexington, MA (US)

(73) Assignee: UChicago Argonne, LLC, Chicago, IL (US)

( * ) Notice: Subject to any disclaimer, the term of this patent is extended or adjusted under 35 U.S.C. 154(b) by 77 days.

(21) Appl. No.: 14/215,947

(22) Filed: Mar. 17, 2014

(65) Prior Publication Data
US 2015/0263259 A1    Sep. 17, 2015

(51) Int. Cl.
*H01L 39/24* (2006.01)
*H01L 39/12* (2006.01)
*H01L 39/14* (2006.01)

(52) U.S. Cl.
CPC .......... *H01L 39/126* (2013.01); *H01L 39/143* (2013.01); *H01L 39/2483* (2013.01); *Y10T 428/24413* (2015.01)

(58) Field of Classification Search
CPC .............................. H01L 39/126; H01L 39/143
USPC .......................................................... 505/320
See application file for complete search history.

(56) References Cited

U.S. PATENT DOCUMENTS

| | | | |
|---|---|---|---|
| 5,093,310 A | 3/1992 | Rosen | |
| 5,096,882 A * | 3/1992 | Kato et al. | 505/325 |
| 5,756,427 A | 5/1998 | Zhou | |
| 5,912,210 A | 6/1999 | Krusin-Elbaum et al. | |
| 6,083,885 A * | 7/2000 | Weinstein | 505/320 |
| 6,308,399 B1 * | 10/2001 | Zhou | C04B 35/45 29/599 |
| 6,638,895 B1 | 10/2003 | Karapetrov et al. | |
| 2006/0073975 A1 * | 4/2006 | Thieme | H01L 39/143 505/125 |
| 2009/0088325 A1 * | 4/2009 | Goyal | C23C 14/08 505/230 |

OTHER PUBLICATIONS

Paulius, et al., "Evolution of the vortex phase diagram in $YBa_2Cu_3O_{7-\delta}$ with random point disorder," Physical Review B, May 2000, vol. 61, No. 18, pp. R11 910-913.

Civale, et al., "Irradiation-Enhanced Pinning in $YBa_2Cu_3O_{7-x}$ Crystals," JOM, Oct. 1992, pp. 60-64.

(Continued)

*Primary Examiner* — Paul Wartalowicz
(74) *Attorney, Agent, or Firm* — Foley & Lardner LLP

(57) ABSTRACT

A method comprising irradiating a polycrystalline rare earth metal-alkaline earth metal-transition metal-oxide superconductor layer with protons having an energy of 1 to 6 MeV. The irradiating process produces an irradiated layer that comprises randomly dispersed defects with an average diameter in the range of 1-10 nm.

9 Claims, 15 Drawing Sheets

(56) References Cited

OTHER PUBLICATIONS

Lee, et al., "Niobium—Titanium Superconducting Wires: Nanostructures by Extrusion and Wire Drawing," Wire Journal International, Feb. 2003, vol. 36, No. 2, pp. 61-66.
Ullmaier, "Irreversible Properties of Type II Superconductors," Springer Tracts in Modern Physics, 1975, vol. 76, 154 pages.
Levin, et al., "The effects of superconductor-stabilizer interfacial resistance on the quench of a current-carrying coated conductor," Superconductor Science and Technology, 2010, vol. 23, No. 014021, 8 pages.
Miura, et al., "Mixed pinning landscape in nanoparticle-introduced $YGdBa_2Cu_3O_y$ films grown by metal organic deposition," Physical Review, 2011, vol. 83, No. 184519, 8 pages.
Wee, et al., "Multifunctional, phase separated, $BaTiO_3+CoFe_2O_4$ cap buffer layers for improved flux-pinning in $YBa_2Cu_3O_{7-\sigma}$ based coated conductors," Superconductor Science and Technology, 2010, vol. 23, No. 014007, 7 pages.
Selvamanickam, et al., "Enhanced and uniform in-field performance in long (Gd, Y)-Ba—Cu—O tapes with zirconium doping fabricated by metal-organic chemical vapor deposition," Superconductor Science and Technology, 2010, vol. 23, No. 014014, 6 pages.
Malozemoff, "Second-Generation High-Temperature Superconductor Wires for the Electric Power Grid," Annual Review of Materials Research, Mar. 2012, vol. 42, pp. 373-397.
Zalamova, et al., "Intermediate phase evolution in YBCO thin films grown by the TFA process," Superconductor Science and Technology, 2010, vol. 23, No. 014012, 11 pages.
Rupich, et al., "Advances in second generation high temperature superconducting wire manufacturing and R&D at American Superconductor Corporation," Superconductor Science and Technology, 2010, vol. 23, No. 014015, 9 pages.
Feldmann, et al., "1000 a $cm^{-1}$ in a 2μm thick $YBa_2Cu_3O_{7-x}$ film with $BaZrO_3$ and $Y_2O_3$ additions," Superconductor Science and Technology, 2010, vol. 23, No. 115016, 8 pages.
Umezawa, et al., "Enhanced critical magnetization currents due to fast neutron irradiation in single-crystal $YBa_2Cu_3O_{7-\sigma}$," Physical Review B, Nov. 1987, vol. 36, No. 13, pp. 7151-7154.
Shiohara, et al., "Overview of Materials and Power Applications of Coated Conductors Project," Japanese Journal of Applied Physics, 2012, vol. 51, No. 01007, 16 pages.
Eisterer, et al., "Neutron irradiation of coated conductors," Superconductor Science and Technology, 2010, vol. 23, No. 014009, 6 pages.
Koshelev, et al., "Theory and simulations on strong pinning of vortex lines by nanoparticles," Physical Review, 2011, vol. 84, No. 104528, 13 pages.
Miura, et al., "Increase of the production rate and crystal growth mode of $GdBa_2Cu_3O_y$-coated conductors using an in-plume growth technique for a reel-to-reel pulsed-laser deposition system," Superconductor Science and Technology, 2010, vol. 23, No. 014019, 8 pages.
Macmanus-Driscoll, et al., "Strongly enhanced current densities in superconducting coated conductors of $YBa_2Cu_3O_{7-x}+BaZrO_3$," Nature Materials, Jul. 2004, vol. 3, pp. 439-443.
Ortalan, et al., "Three dimensional analyses of flux pinning centers in Dy-doped $YBa_2Cu_3O_{7-x}$, coated superconductors by STEM tomography," Physica C, 2009, vol. 469, pp. 2052-2059.
Kirk, "Structure and flux pinning properties of irradiation defects in $YBa_2Cu_3O_{7-x}$," Cryogenics, 1993, vol. 33, No. 3, pp. 235-242.
Schmidt, et al., "Design and test of current limiting modules using YBCO-coated conductors," Superconductor Science and Technology, 2010, vol. 23, No. 014024, 9 pages.
Foltyn, et al., "Materials science challenges for high-temperature superconducting wire," Nature Materials, Sep. 2007, vol. 6, pp. 631-642.
Amemiya, et al., "Ac losses in two-layer superconducting power transmission cables consisting of coated conductors with a magnetic substrate," Superconductor Science and Technology, 2010, vol. 23, No. 014022, 8 pages.

Van Der Beek, et al., "Strong pinning in high-temperature superconducting films," Physical Review B, 2002, vol. 66, No. 024523, 10 pages.
Greene, et al., "The Effect of Proton Irradiation on the Critical Current of Commercially Produced YBCO Conductors," IEE Transactions on Applied Superconductivity, Jun. 2009, vol. 19, No. 3, pp. 3164-3167.
Freydhardt, et al., "Coated conductors and their applications," Superconductor Science and Technology, 2010, vol. 23, No. 010201, 1 page.
Maiorov, et al., "Synergetic combination of different types of defect to optimize pinning landscape using $BaZrO_3$-doped $YBa_2Cu_3O_7$," Nature Materials, Apr. 2009, vol. 8, pp. 398-404.
Welp, et al., "A method for enhancing the critical currents of post production YBCO coated conductors," Argonne National Laboratory, Presentation, 2013, 17 pages.
Hua, et al., "Vortex pinning by compound defects in $YBa_2Cu_3O_{7-\sigma}$," Physical Review B, 2010, vol. 82, No. 024505, 4 pages.
Ovchinnikov and Ivlev, "Pinning in layered inhomogeneous superconductors," Physical Review B, Apr. 1991, vol. 43, No. 10, pp. 8024-8029.
Stan, et al., "Investigation of $(Y,Gd)Ba_2Cu_3O_{7-x}$ grown by MOCVD on a simplified IBAD MgO template," Superconductor Science and Technology, 2010, vol. 23, No. 014011, 4 pages.
Rupich, et al., "Metalorganic Deposition of YBCO Films for Second-Generation High-Temperature Superconductor Wires," MRS Bulletin, Aug. 2004, pp. 572-578.
Li, et al., "The Development of Second Generation HTS Wire at American Superconductor," IEEE Transactions on Applied Superconductivity, 2009, vol. 19, No. 3, pp. 3231-3235.
Maroni, et al., "Raman and x-ray absorption spectroscopy characterization of Zr-doped MOCVD $YBa_2Cu_3O_{6+o}$," Superconductor Science and Technology, 2010, vol. 23, No. 014020, 10 pages.
Jia, et al., "Doubling the critical current density of high temperature superconducting coated conductors through proton irradiation," Applied Physics Letters, 2013, vol. 103, No. 122601, 6 pages.
Kang, et al., "High-Performance High-$T_c$ Superconducting Wires," Science, Mar. 2006, vol. 311, No. 1911, pp. 1911-1914.
Welp, et al., "A method for enhancing the critical currents of post-production YBCO coated conductors," Argonne National Laboratory, Invention Disclosure, 2013, 15 pages.
Kakimoto, et al., "High-speed deposition of high-quality RE123 films by a PLD system with hot-wall heating," Superconductor Science and Technology, 2010, vol. 23, No. 014016, 4 pages.
Miura, et al., "Formation mechanism of $BaZrO_3$ nanoparticles in $Y_{1-x}SM_xBa_2Cu_3O_y$-coated conductors derived from trifluoroacetate metal-organic deposition," Superconductor Science and Technology, 2010, vol. 23, No. 014013, 5 pages.
Kirk, et al., "Structure and properties of irradiation defects in $YBa_2Cu_3O_{7-x}$," Micron, 1999, vol. 30, pp. 507-526.
Campbell, et al., "Flux vortices and transport currents in type II superconductors," Advances in Physics, 1972, vol. 29, No. 90, pp. 199-428.
Aytug, et al., "Enhanced flux pinning in MOCVD-YBCO films through Zr additions: systematic feasibility studies," Superconductor Science and Technology, 2010, vol. 23, No. 014005, 7 pages.
Civale, "Vortex pinning and creep in high-temperature superconductors with columnar defects," Superconductor Science & Technology, 1997, vol. 10, pp. A11-A28.
Xiong, et al., "Transport properties, phase transition, and recovery near 200 K of proton-irradiate $YBa_2Cu_3O_7$thin films," Physical Review B, Jul. 1988, vol. 38, No. 1, pp. 240-243.
Matias, et al., "YBCO films grown by reactive co-evaporation on simplified IBAD-MgO coated conductor templates," Superconductor Science and Technology, 2010, vol. 23, No. 014018, 5 pagse.
Huhne, et al., "Application of textured IBAD-TiN buffer layers in coated conductor architectures," Superconductor Science and Technology, 2010, vol. 23, No. 014010, 6 pages.
Matsumoto, et al., "Artificial pinning center technology to enhance vortex pinning in YBCO coated conductors," Superconductor Science and Technology, 2010, vol. 23, No. 014001, 12 pages.

(56) References Cited

OTHER PUBLICATIONS

Civale, et al., "Defect Independence of the Irreversibility Line in Proton-Irradiated Y—Ba—Cu—O Crystals," Physical Review Letters, Aug. 1990, vol. 65, No. 9, pp. 1164-1167.

Hanyu, et al., "Fabrication of km-length IBAD-MgO substrates at a production rate of km $h^{-1}$," Superconductor Science and Technology, 2010, vol. 23, No. 014017, 4 pages.

Thompson, et al., "Field, temperature, and angle dependent critical current density $J_c(H, T, \theta)$ in coated conductors obtained via contact-free methods," Superconductor Science and Technology, 2010, vol. 23, No. 014002, 6 pages.

Awaji, et al., "Flux pinning properties of TFA-MOD (Y,Gd)$Ba_2Cu_3O_x$ tapes with $BaZrO_3$ nanoparticles," Superconducting Science and Technology, 2010, vol. 23, No. 014006, 5 pages.

Selvamanickam, et al., "Enhanced critical currents in (Gd,Y)$Ba_2Cu_3O_x$ superconducting tapes with high levels of Zr addition," Superconductor Science and Technology, 2010, vol. 26, No. 035006, 9 pages.

Van Der Laan, et al., "The effect of strain on grains and grain boundaries in $YBa_2Cu_3O_{7-\sigma}$ coated conductors," Superconductor Science and Technology, 2010, vol. 23, No. 014004, 7 pages.

Xu, et al., "Angular dependence of $Jc$ for YBCO coated conductors at low temperature and very high magnetic fields," Superconductor Science and Technology, 2010, vol. 23, No. 014003, 7 pages.

Solovyov, et al., "Nature of $Y_1Ba_2Cu_3O_7$ nucleation centers on ceria buffers," Superconductor Science and Technology, 2010, vol. 23, No. 014008, 10 pages.

Pleva, et al., "Conductor requirements for high-temperature superconducting utility power transformers," Superconductor Science and Technology, 2010, vol. 23, No. 014025, 5 pages.

Polat, et al., "Thickness dependenc of magnetic relaxation and $E$-$J$ characteristics in superconducting (Gd—Y)—Ba—Cu—O films with strong vortex pinning," Physical Review B, 2011, vol. 84, No. 024519, 13 pages.

Gupta, et al., "Second Generation HTS Quadrupole for FRIB," IEEE Transactions on Applied Superconductivity, Jun. 2011, vol. 21, No. 3, pp. 1888-1891.

Lee, et al., "Niobium-Titanium Superconducting Wires: Nanostructures by Extrusion and Wire Drawing," Interwire 2001, May 2001, Presentation.

\* cited by examiner

– 1 –

CREATION OF HIGH-PINNING MICROSTRUCTURES IN POST PRODUCTION YBCO COATED CONDUCTORS

STATEMENT OF GOVERNMENT INTERESTS

The United States government has rights in this invention described herein pursuant to Contact No. DE-AC02-06CH11357 between the United States Department of Energy and UChicago Argonne, LLC, as operator of Argonne National Laboratory.

FIELD OF THE INVENTION

The present invention generally relates to high-pinning microstructures and a method of creating these high-pinning microstructures in post-production YBCO coated conductors.

BACKGROUND

Coated conductors have many applications. A coated conductor includes a superconductor layer deposited over a flexible metal substrate and metal oxide buffer layers disposed between the superconductor layer and the flexible metal substrate. Coated conductor production-line wires of hundreds of meters in length have been produced with critical current densities, $J_c$, of 3 MA/cm$^2$ at 77 K and self-field. These materials exhibit a suppression of $J_c$ in magnetic fields, especially in fields applied along the crystallographic c-axis of the superconductor. This characteristic limits the applicability of these materials for applications that require operation in magnetic fields such as motors, transformers, generators, solenoids and MRI systems.

SUMMARY

One implementation relates to a polycrystalline rare earth metal-alkaline earth metal-transition metal-oxide superconductor layer comprising uniformly distributed randomly dispersed defects with an average diameter in the range of 1-10 nm.

Another implementation relates to a method comprising irradiating a polycrystalline rare earth metal-alkaline earth metal-transition metal-oxide superconductor layer with protons having an energy of 2 to 5 MeV. The irradiating process may produce an irradiated layer that comprises uniformly distributed randomly dispersed defects with an average diameter in the range of 1-10 nm.

Additional features, advantages, and embodiments of the present disclosure may be set forth from consideration of the following detailed description, drawings, and claims. Moreover, it is to be understood that both the foregoing summary of the present disclosure and the following detailed description are exemplary and intended to provide further explanation without further limiting the scope of the present disclosure claimed.

BRIEF DESCRIPTION OF THE DRAWINGS

The foregoing and other objects, aspects, features, and advantages of the disclosure will become more apparent and better understood by referring to the following description taken in conjunction with the accompanying drawings, in which.

DETAILED DESCRIPTION OF THE PREFERRED EMBODIMENTS

Figure 1:
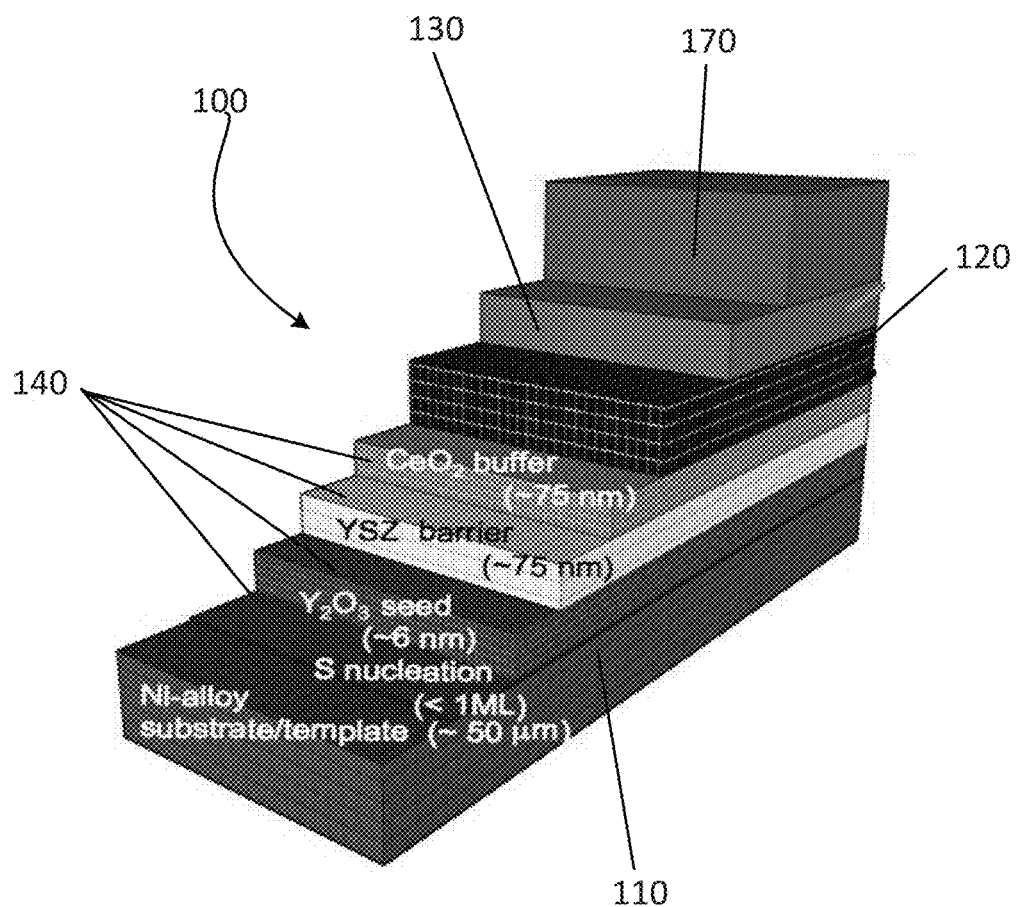
FIG. 1 shows the structure of a coated conductor according to one embodiment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

In some implementations, a superconductor layer containing uniformly distributed randomly dispersed defects with an average diameter of 1-10 nm is provided. These randomly dispersed defects may induce an enhancement of the critical current density of the superconductor layer in a c-axis applied magnetic field. The enhancement when the magnetic field is higher than 1.5 T may be more than 10% with respect to a reference superconducting layer of the same composition and microstructure in the absence of the randomly dispersed defects. According to another implementation, the enhancement when the magnetic field is higher than 1.5 T may be more than 40% with respect to a reference superconducting layer of the same composition and microstructure in the absence of the randomly dispersed defects.

In other implementations, a superconductor layer with a thickness of greater than 1 µm containing a mixed pinning landscape is provided. The mixed pinning landscape may include randomly dispersed defects with an average diameter of 1-10 nm and at least one of metal oxide precipitates, stacking faults, columnar defects, and twin boundaries. The superconductor layer may be disposed over a metal substrate.

In other implementations, a superconductor film disposed over a substrate is provided. The superconductor film may be formed of a rare earth oxide metal-alkaline earth metal-transition metal-oxide superconductor containing a mixed pinning landscape. The mixed pinning landscape may include randomly dispersed defects with an average diameter of 1-10 nm and at least one of metal oxide precipitates, stacking faults, columnar defects, and twin boundaries. The superconductor layer may be disposed over a metal substrate.

In some implementations, a method of introducing randomly distributed defects with an average diameter of 1-10 nm into a superconductor layer is provided. The superconductor layer may include at least one of metal oxide precipitates, stacking faults, columnar defects, and twin boundaries prior to the introduction of the randomly distributed defects. The introduction of the randomly distributed defects may increase the critical current of the superconductor layer by greater than 10% at a temperature of 27 K in a magnetic field applied perpendicular to the plane of the superconductor layer. According to one implementation, the introduction of the randomly distributed defects may increase the critical current of the superconductor layer by greater than 40% at a temperature of 27 K in a magnetic field applied perpendicular to the plane of the superconductor layer.

In other implementations, a method of irradiating coated conductors containing a superconductor layer with protons having and energy of 2-5 MeV is provided. The irradiation may create randomly dispersed small defects in the superconductor layer in addition to pre-existing defect structures present in the superconductor layer prior to the irradiation. The combination of the randomly dispersed small defects and the pre-existing defect structure may produce a superconductor layer with a mixed pinning landscape that exhibits enhanced critical currents. The enhancement of the critical currents may be especially apparent in high magnetic fields.

In other implementations, a method for enhancing the critical current of ready-made production-line coated conductors by inducing the formation of uniformly distributed randomly dispersed small defects is provided.

As utilized herein, coated conductors are materials containing a polycrystalline superconductor layer disposed over a substrate containing a flexible metal film coated with at least one buffering metal oxide layer. The flexible metal film may be formed of any suitable metal containing material. According to one embodiment, the flexible metal substrate is a nickel containing alloy.

A textured substrate may be provided. The substrate may include texture that is transferred to the superconductor layer. As utilized herein, texture refers to a microstructure including crystal plane alignment. A high degree of crystal plane alignment in the superconductor layer allows the polycrystalline superconductor layer to exhibit single crystal-like performance. The textured substrate may be the flexible metal film or one of the other layers described above. Alternatively, the textured substrate may be a separate layer within the coated conductor.

The textured substrate may be produced by any appropriate process. According to one embodiment, the textured substrate may be produced by a rolling-assisted biaxially textured substrate (RABiTS) process. The RABiTS process includes the production of a biaxially textured metal film by a rolling assisted process. At least one oxide buffer layer is then provided on the textured metal film, with the oxide buffer layer exhibiting the same biaxially textured microstructure as the metal film. A superconductor layer is then deposited over the oxide buffer layer. The oxide buffer layer prevents the diffusion of metal from the film to the superconductor layer. A typical RABiTS coated conductor structure is depicted in FIG. 1. The RABiTS coated conductor 100 includes a metal film template 110, oxide buffer layers 140, a superconductor layer 120, a metallic protective layer 130 and a stabilizer layer 170.

Figure 2:
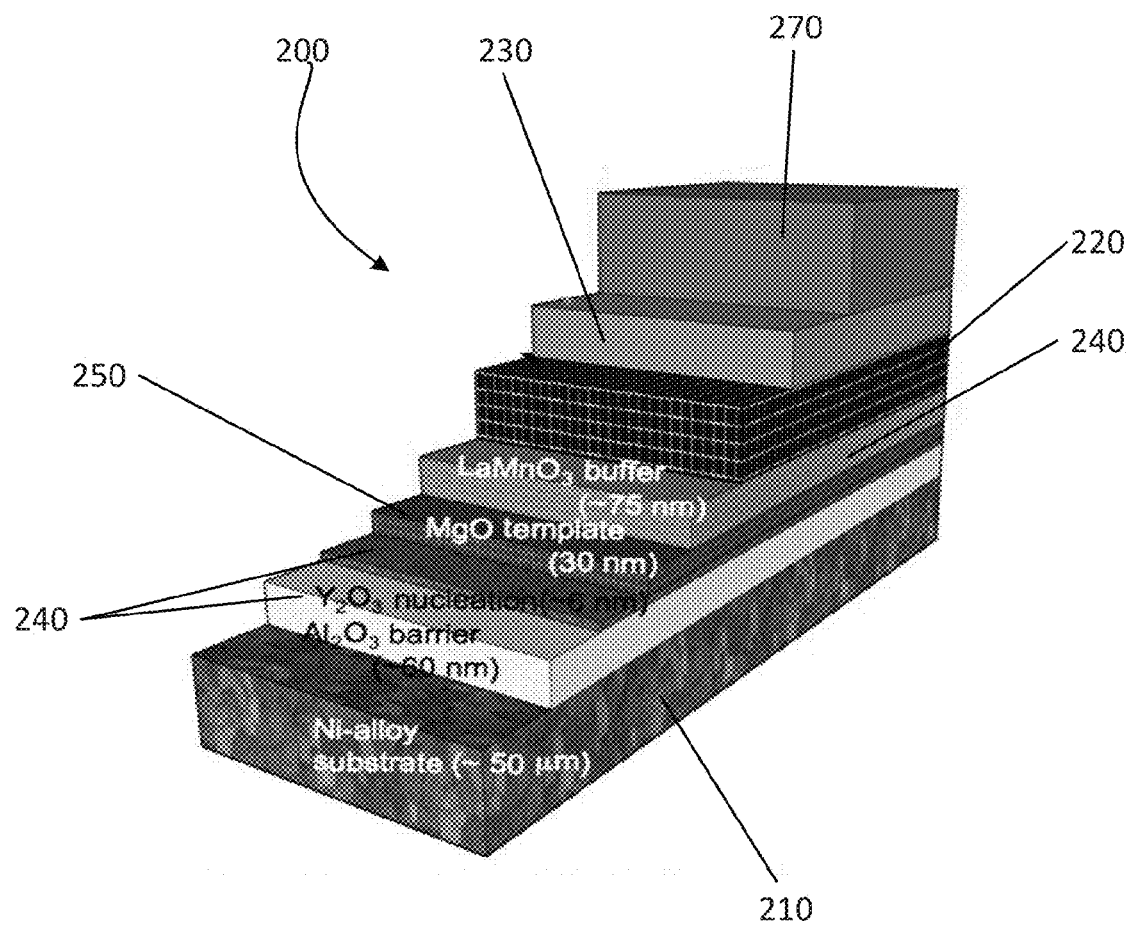
FIG. 2 shows the structure of a coated conductor according to another embodiment.

According to another embodiment, the textured substrate may be produced by a process including ion-beam assisted deposition (IBAD). The IBAD process includes the ion-beam assisted deposition of a textured ceramic buffer layer over an untextured metal film. A superconductor layer is then deposited over the textured ceramic buffer layer. Additional buffer layers may be provided between the textured ceramic buffer layer and the superconductor layer and/or between the metal film and the textured ceramic buffer layer. A typical IBAD coated conductor structure is depicted in FIG. 2. The IBAD coated conductor 200 includes a metal film substrate 210, a textured ceramic oxide buffer layer 250, oxide buffer layers 240, a superconductor layer 220, a metallic protective layer 230 and a stabilizer layer 270.

The superconductor layer may be deposited over the oxide buffer layer of the coated conductor structure by any suitable process. According to one embodiment, the superconductor layer may be deposited by a metal-organic deposition process. According to another embodiment, the superconductor layer may be deposited by a pulsed laser deposition (PLD), reactive co-evaporation (RCE), metal-organic chemical vapor deposition (MOCVD), electron beam deposition, chemical vapor deposition (CVD), or sputtering process. The superconductor layer may have any appropriate thickness. According to one embodiment, the superconductor layer has a thickness greater than 1 µm. In another embodiment, the superconductor layer has a thickness in the range of about 1 µm to about 2 µm. According to some embodiments, the superconductor may have a thickness of less than about 5 µm.

A protective metal layer may be deposited over the superconductor layer of the coated conductor for the purposes of protecting the superconductor layer. The protective metal layer may be any suitable metal containing material. According to one embodiment, the protective metal layer is a silver layer. The protective layer may have any appropriate thickness. According to one embodiment, the protective layer has a thickness of 3 µm. Thinner protective layers may interact with the radiation beam to a lesser extent, reducing the energy required for the beam to reach the superconductor layer. In one embodiment, the protective layer may have a thickness of less than about 5 µm. A stabilizer layer may be deposited over the protective metal layer. According to one embodiment the stabilizer layer may include copper. The stabilizer layer may have a thickness greater than 10 µm. In one embodiment, the stabilizer layer may be added after the superconductor layer is irradiated.

The superconductor layer may be formed of any appropriate superconductor. According to one embodiment the superconductor layer may be a rare earth metal-alkaline earth metal-transition metal-oxide superconductor. According to one embodiment, the superconductor layer may contain a superconductor with the general formula:

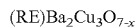

where RE includes at least one rare earth metal and 0≤x≤0.65. According to another embodiment, the superconductor layer may contain a superconductor with the general formula:

where RE includes at least one rare earth metal. In one embodiment, RE may include yttrium, producing a superconductor layer of the general formula $YBa_2Cu_3O_7$ (YBCO). While the superconductor layer will be referred to herein as a YBCO superconductor layer for the purposes of convenience, the methods discussed in this application apply equally to other appropriate superconductor materials. In some cases, RE may be a mixture of two or more rare earth metals.

The superconductor layer may also include a dopant in addition to the primary rare earth metal. The dopant may be a rare earth metal. According to one embodiment, a YBCO superconductor layer may include a dysprosium dopant. The dopant may be present in an amount of up to 75% relative to the primary rare earth metal. According to one embodiment, the dopant is present in an amount of at least about 1% and at most about 50% of the primary rare earth metal.

The superconductor layer of the coated conductors may exhibit decreased critical current densities, $J_c$, when exposed to magnetic fields. The reduction of $J_c$ is a result of the formation of vortices in the superconductor material when a magnetic field is applied. When a current is passed through the superconductor vortices experience a Lorenz force that is proportional to the current. When the Lorenz force becomes sufficiently large vortices will move, at which point Ohmic dissipation arises and the superconductor loses its superconducting properties. The current density at which the Lorenz force is large enough to set vortices in motion is referred to as the critical current density, $J_c$. The value of $J_c$ as function of temperature and magnetic field determines the range of applications that can be realized with a specific superconducting material. In order to achieve high values of the critical current density, flux pinning may be employed to prevent movement of the vortices.

Flux pinning may be achieved by the inclusion of defects in the superconductor material. The defects that are included in the superconductor material may be any suitable defect capable of pinning a vortex. Large defects that strongly pin vortices may be selected from metal oxide precipitates, columnar defects, stacking faults, twin boundaries, and combinations thereof. According to one embodiment, the superconductor layer may include metal oxide precipitates with an average diameter of greater than 15 nm as large pinning defects. Large defects are capable of pinning the vortices that form under the application of a low magnetic field. As the magnetic field increases, interstitial vortices that the large defects are not capable of strongly pinning begin to form within the superconductor material. The formation of weakly pinned interstitial vortices produces a reduction in the critical current density of the superconductor layer under the application of high magnetic fields.

The interstitial vortices formed in the superconductor material under the application of high magnetic fields may be pinned by the inclusion of small randomly dispersed defects in the superconductor material. The randomly dispersed defects may have an average diameter of 1-10 nm. According to one embodiment the randomly dispersed defects may have an average diameter of 2-5 nm. The randomly dispersed defects may be uniformly distributed throughout the superconductor material, including being uniformly distributed throughout the thickness of the superconductor material. The randomly dispersed defects may be point defects, clusters of point defects and small collision cascades. According to one embodiment, the randomly dispersed defects may be anisotropic. The anisotropic randomly dispersed defects may exhibit a plate-like structure.

Figure 3:
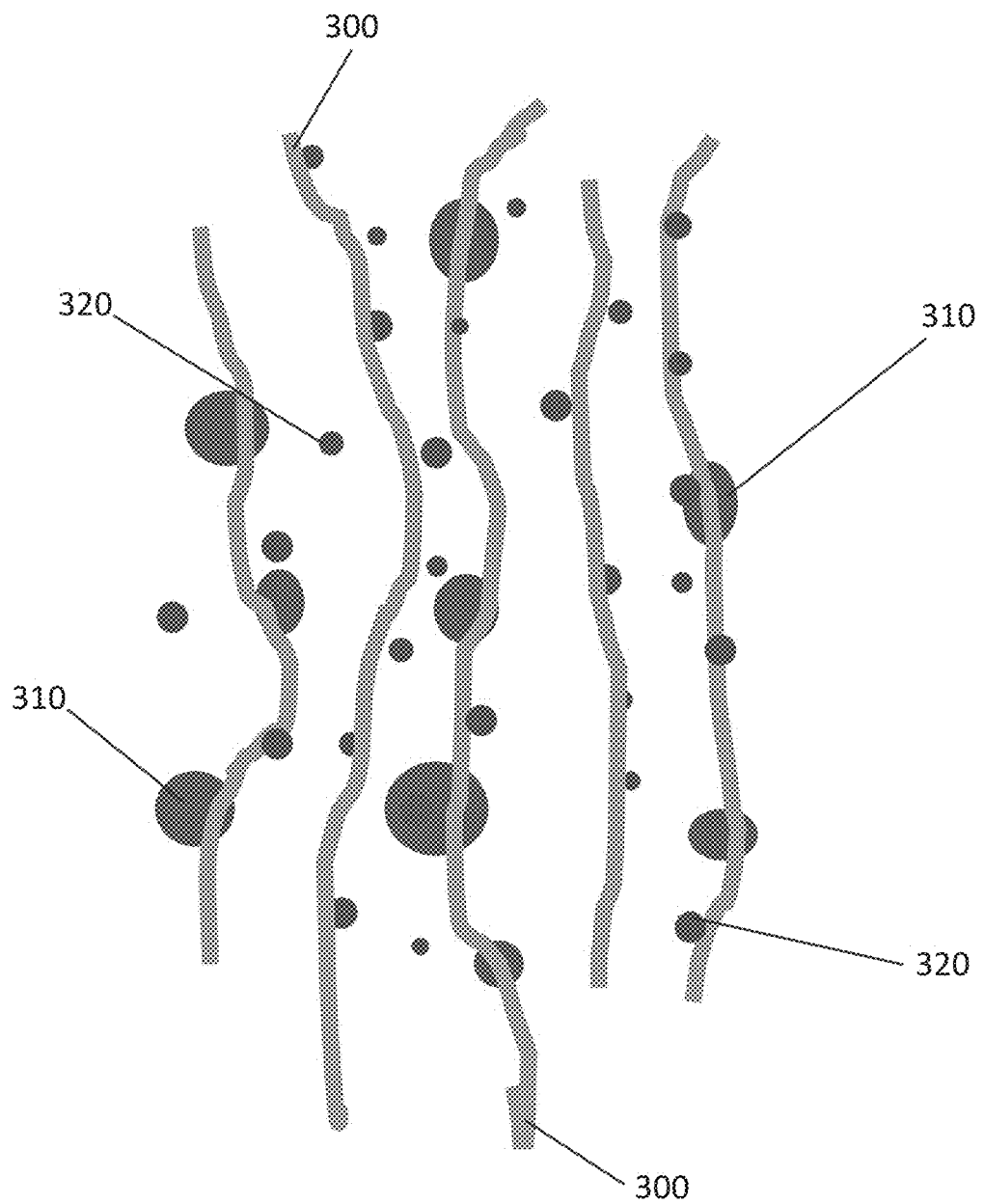
FIG. 3 is a representation of the pinning of vortices by a defect structure including rare earth oxide precipitates and randomly dispersed defects.

The superconductor layer may include a mixed pinning landscape that includes both large defects and small randomly dispersed defects. A mixed pinning landscape allows a superconductor to benefit from both the low magnetic field strong pinning behavior of large defects and the high magnetic field interstitial vortex pinning capabilities of randomly dispersed defects. FIG. 3 depicts a schematic representation of a mixed pinning landscape in which vortices 300 are pinned by both large defects 310 and randomly dispersed defects 320. According to one embodiment, a mixed pinning landscape may include randomly dispersed defects having an average diameter of 1-10 nm and at least one of metal oxide precipitates, columnar defects, stacking faults, and twin boundaries. There may be an optimum concentration of the randomly dispersed defects such that the enhancement of critical current density is at a maximum. The optimum concentration may depend on the desired operating temperature and the pre-existing defect structure of the superconductor layer prior to irradiation. The enhancement of the critical current density generally increases with increasing concentration of the randomly dispersed defects. At very high randomly dispersed defect concentrations the critical temperature and the superconducting cross-section that carries the current will be reduced, producing a reduction in the critical current density.

The formation of large defects in the superconductor material may be achieved in coated conductor production through any suitable process. According to one embodiment, the large defects may be formed by the precipitation of oxide nanoparticles. The oxide nanoparticles may be rare earth oxide precipitates. The nanoparticles may have the general formula $RE_2O_3$ where RE is at least one rare earth oxide. In one embodiment, RE may be a mixture of the primary rare earth metal and a dopant. According to one embodiment, the nanoparticles may have a diameter of about 100 nm or less, such as a diameter in the range of about 10 nm to about 100 nm. Barium-zirconate (BZO) nanoparticles may be precipitated in YBCO coated conductors and self-assembled to form nanorods with sizes that closely match those of superconducting vortices. According to another embodiment, the large defects may be formed by altering the chemical precursors and the deposition and film growth conditions employed in the fabrication of coated conductors.

The randomly dispersed defects may be formed by irradiation of a coated conductor with medium energy protons. According to one embodiment, the medium energy protons may be protons with an energy of about 1 MeV to about 6 MeV, such as about 2 MeV to about 5 MeV. In the case that the energy of the protons is too low, the protons may not travel far enough in to the superconductor layer to produce uniformly distributed randomly dispersed defects. In the case that the energy of the protons is too high, undesired nuclear activation may occur. According to an alternative embodiment, the randomly dispersed defects may be formed by irradiation with neutrons or ions, such as Au, Ar or Ag ions. In one embodiment, the irradiation may take place along the crystallographic c-axis of the superconductor layer of the coated conductor. The irradiation may be successfully carried out through a metallic protective layer of the coated conductor that is disposed over the superconductor layer. The irradiation method may be applied to ready-made production-line coated conductors to produce randomly dispersed defects without the modification of the precursor chemistry or film growth conditions of the coated conductors.

The irradiation fluence may be at least $1.5 \times 10^{16}$ p/cm$^2$. According to one embodiment, the irradiation fluence may be in the range of $1.5 \times 10^{16}$ p/cm$^2$ to $30 \times 10^{16}$ p/cm$^2$. The concentration of the randomly dispersed defects may be influenced by the irradiation fluence and microstructure of the coated conductor. According to one embodiment the concentration of the randomly dispersed defects may be on the order of about $2 \times 10^{16}$ cm$^{-3}$ after irradiation with 3.5 MeV protons to a fluence of $2 \times 10^{16}$ p/cm$^2$.

The p-beam currents employed in the irradiation process may be any appropriate amount. The p-beam current may be selected to prevent the temperature of the coated conductor from exceeding 200° C. during the irradiation process. In one embodiment the p-beam current is selected to prevent the temperature of the coated conductor from exceeding 100° C. during the irradiation process. According to one embodiment, a coated conductor that is not actively cooled during irradiation is subjected to a p-beam current of 250 nA or less. According to another embodiment, a coated conductor is cooled while being irradiated by a p-beam current of up to 1 µA. The cooling may be achieved by mounting the coated conductor on a cooled sample mounting stage. In yet another embodiment, p-beam currents in the range of 200 to 300 nA may be employed.

The irradiation process allows the addition of randomly dispersed defects to a superconductor with a pre-existing defect structure. This allows the creation of large defects and randomly dispersed defects in a coated conductor independently and synergistically for the formation of a mixed pinning landscape. The irradiation process may be employed to treat production-line YBCO coated conductors in a continuous process. According to one embodiment, the irradiation process may be a continuous process utilizing a roll-to-roll or reel-to-reel system.

The increased critical currents of the coated conductors produced as a result of the irradiation process render them especially suitable for use in applications subject to an applied magnetic field. The irradiated coated conductors may be employed in motors, transformers, generators, magnet systems and solenoids. According to one embodiment, the irradiated coated conductors may be employed in a Magnetic Resonance Imaging (MRI) system.

EXAMPLES

Samples of coated conductors were produced that included a YBCO film deposited by metal-organic deposition onto rolling assisted biaxially textured substrates. The YBCO film was Dy-doped and had a nominal thickness of 1.2 µm, calculated on the basis of a YBCO coating of 7200 mg/cm$^2$ and excluding porosity and Dy$_2$O$_3$. The coated conductors included a 3 µm thick layer of Ag protecting the YBCO film. Unless otherwise stated, the samples were irradiated with 4 MeV-protons along the normal of the YBCO film plane (c-axis) at p-beam currents of 200 to 300 nA. The YBCO film included rare-earth oxide precipitates having the general formula RE$_2$O$_3$ where RE is a mixture of Y and Dy and diameters of several tens of nanometers.

The irradiation of the samples to a fluence of $8 \times 10^{16}$ p/cm$^2$ provides a near doubling of the critical current in fields of 6 T along the c-axis at a temperature of 27 K over the already high $I_c$-values of the coated conductors. The irradiated samples at a temperature of 27 K exhibit a critical current of 938 A/cm-w ($J_c$=7.8 MA/cm$^2$) in a field of 3 T along the c-axis and 634 A/cm-w ($J_c$=5.3 MA/cm$^2$) in a field of 6 T along the c-axis. By comparison, a non-irradiated sample at a temperature of 27 K exhibits a critical current of ~350 A/cm-w ($J_c$=2.9 MA/cm$^2$) in a field of 6 T along the c-axis, and does not reach 600 A/cm-w at temperatures above about ~12 K. The irradiation of YBCO coated conductors with high-energy (142 MeV protons) produced a reduction of the critical current at 77 K in zero applied field and at 77 K in a field of 1 T that grows in proportion to proton fluence. Similarly, irradiation with low-energy protons (0.18 MeV) results in a decrease in critical current at 77 K in a self-field and at 30 K in a field of 1 T with increasing proton fluence between $10^{11}$ and $10^{16}$ p/cm$^2$.

Other non-irradiated samples were investigated as a comparison to the irradiated samples. A 1.55 µm thick Gd-doped YBCO film that contained BZO-precipitates exhibited a critical current density of ~5 MA/cm$^2$ in a 6 T magnetic field applied along the c-axis at a temperature of 4.2 K. A 0.6 µm thick BZO-containing film on an IBAD-type substrate exhibited a critical current density of ~2 MA/cm$^2$ in a 6 T field applied along the c-axis at a temperature of 40 K. A (Y—Gd)$_2$O$_3$ precipitate-containing YBCO film with a thickness of 2.8 µm on an IBAD-type substrate yielded a critical current density of 0.9 MA/cm$^2$ in a 6 T field applied along the c-axis at a temperature of 40 K. A film grown in a modified Zr-doping process yielded a critical current density of ~5 MA/cm$^2$ in a 6 T field applied along the c-axis at a temperature of 30 K. Thus, the irradiated samples compare favorably with other non-irradiated materials.

Figure 4:
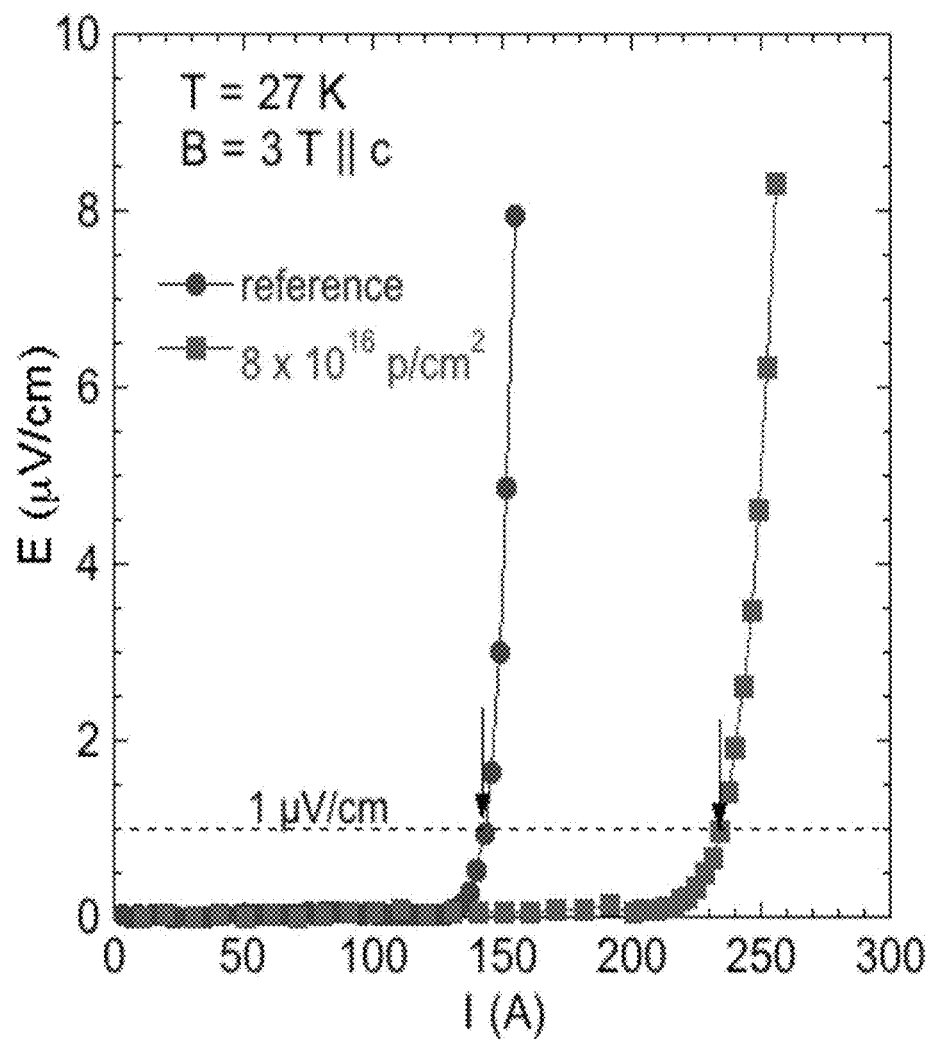
FIG. 4 shows current-electric field curves at 27 K and 3 T along the c-axis.

FIG. 4 depicts a comparison of the electric field versus current (E-I) curves at 27 K and an applied magnetic field of 3 T along the c-axis for a non-irradiated reference sample and a sample irradiated to a fluence of $8 \times 10^{16}$ p/cm$^2$. The near parallel shift of the curves reveals a substantial increase of $I_c$ from 143.6 A to 234.5 A. The critical current $I_c$ was measured on a 2.5 mm wide bridge and is defined using the 1-µV/cm criterion, as illustrated by the dashed line in FIG. 4. The E-I curves exhibit little broadening, as evidenced by the slight decrease of the n-value (in E~I$^n$) from 28 for the reference sample to 25 for the irradiated sample.

Figure 5:
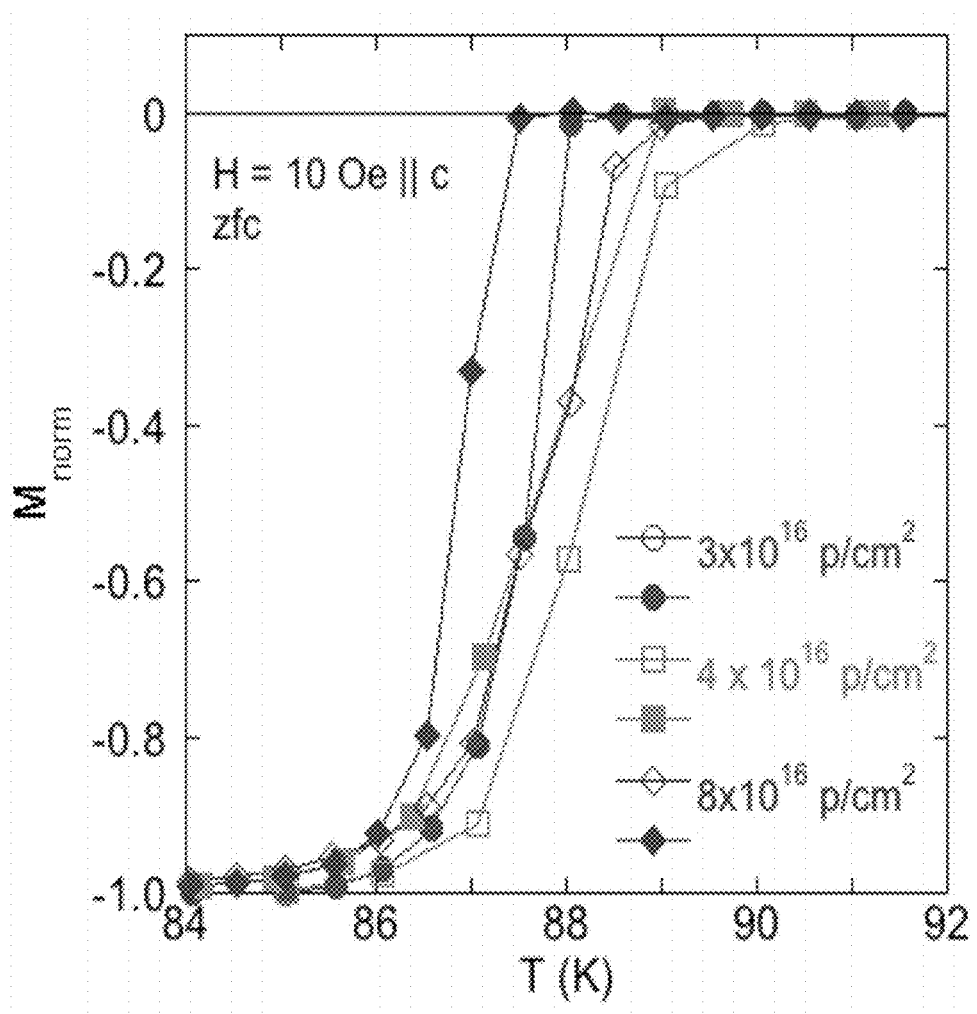
FIG. 5 shows the relationship of $T_c$ to irradiation fluence as determined by the magnetic transition measured in a 10 Oe field along the c-axis after zero field cooling.

FIG. 5 depicts the evolution of the superconducting transition temperature $T_c$ with irradiation fluence. $T_c$ is measured in an auxiliary magnetic field of 10 Oe along the c-axis after zero-field cooling. The open and closed symbols in FIG. 5 represent the pre and post-irradiation states, respectively. As shown in FIG. 5, $T_c$ is suppressed by only ~1.5 K after a relatively high irradiation fluence of $\sim 8 \times 10^{16}$ p/cm$^2$. By comparison, YBCO single crystals irradiated with 3.5 MeV protons at a fluence of $2 \times 10^{16}$ p/cm$^2$ exhibited a decrease by about 2 K of $T_c$.

Figure 6:
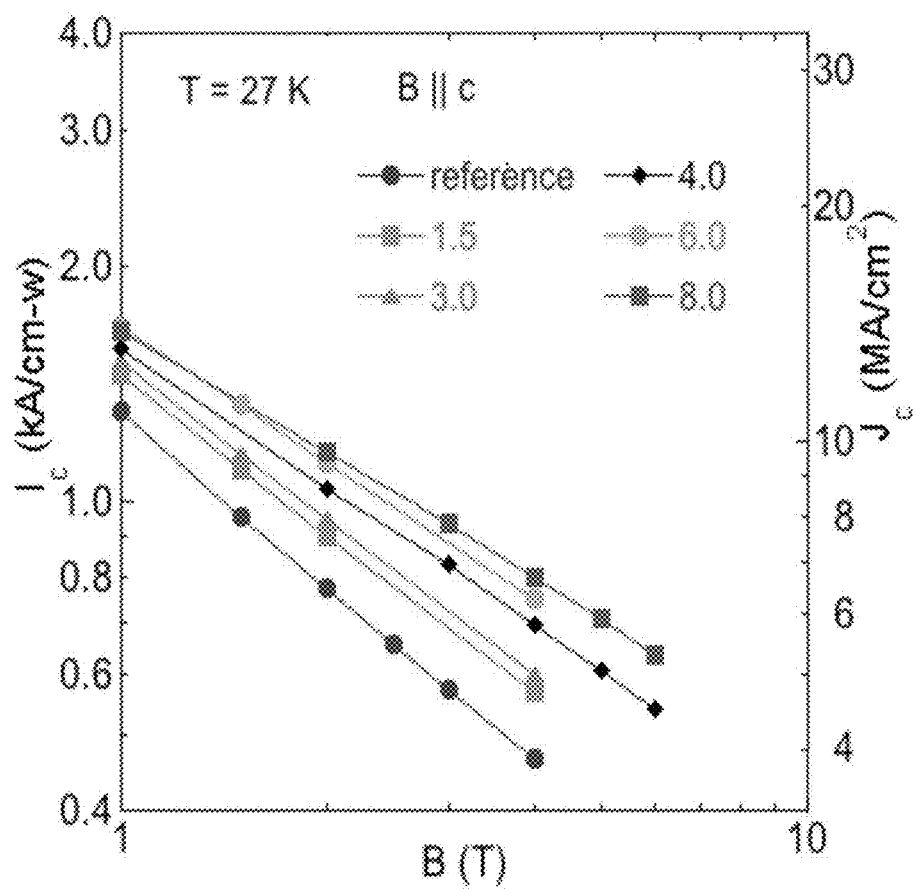
FIG. 6 shows the relationship between critical current and magnetic field and between critical current density and magnetic field for various p-fluences indicated in units of $10^{16}$ p/cm$^2$.

The evolution of the critical current (left y-axis) and critical current density (right y-axis) with irradiation fluence (in units of $\times 10^{16}$ p/cm$^2$) and applied magnetic field is summarized in FIG. 6. Upon irradiation, $I_c$ is systematically enhanced, reaching 634 A/cm-w (5.3 MA/cm$^2$) in a field of 6 T along the c-axis at 27 K. The log-log plot of the data shown in FIG. 6 reveals that in the field range of 1 T to 6 T, $I_c$ for all p-irradiation fluences is well described by the relation $I_c \sim B^{-\alpha}$. The data indicates that p-irradiation minimizes the magnetic-field induced suppression of $I_c$. Irradiation decreases the exponent α from ~0.75 for the reference sample to ~0.52 after irradiation to a fluence of $8 \times 10^{16}$ p/cm².

Figure 7:
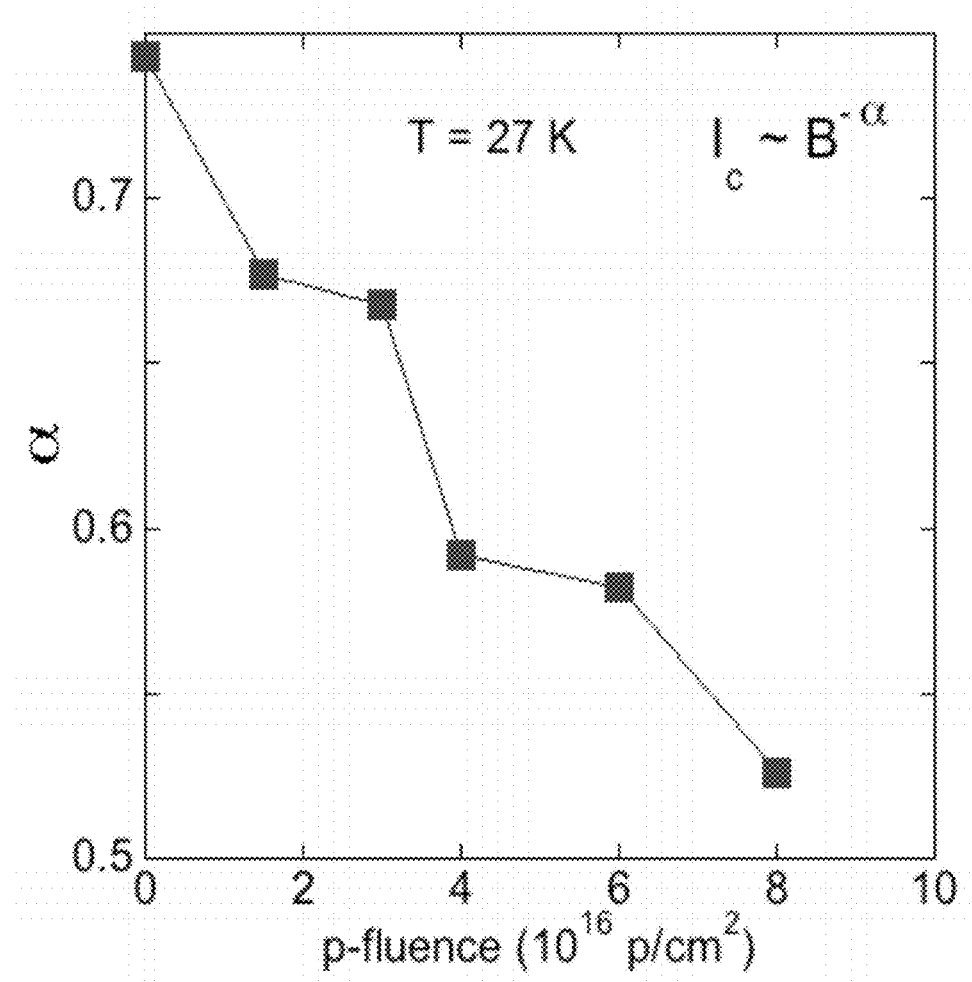
FIG. 7 shows the relationship between the irradiation fluence and the exponent $\alpha$.

As shown in FIG. 7, the exponent α decreases with increasing irradiation fluence. The plot in FIG. 7 includes data for transport measurements at 27 K.

Figure 8:
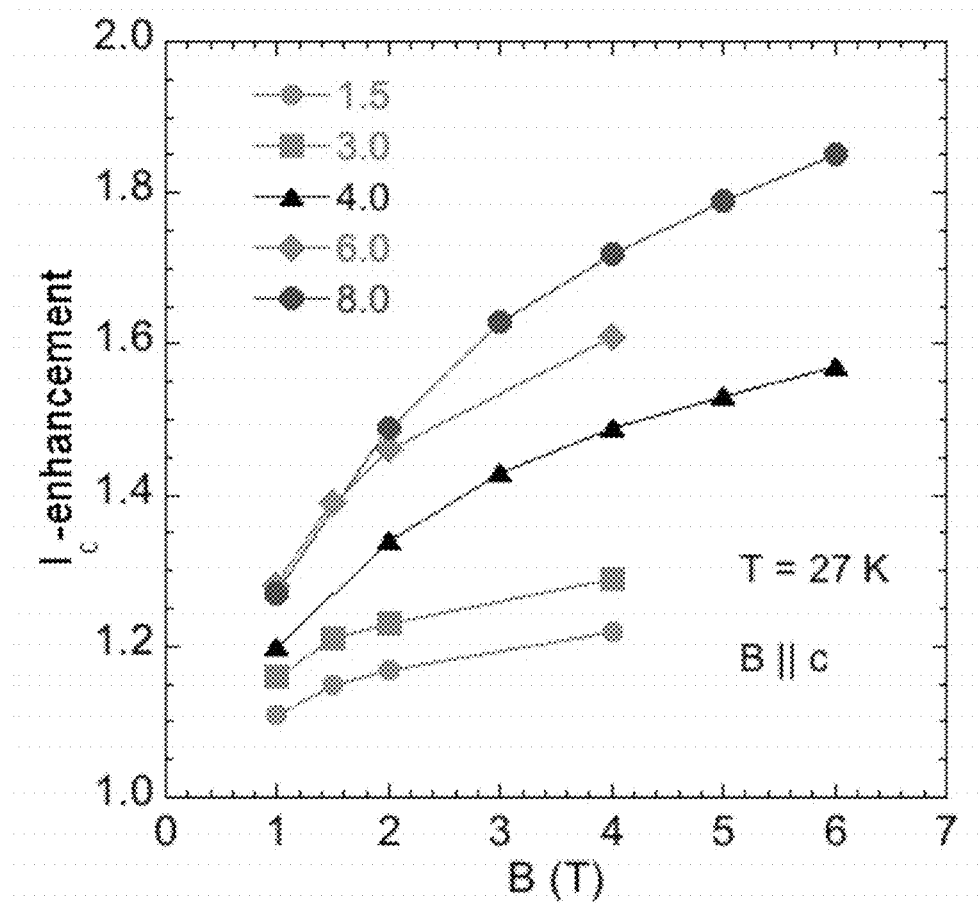
FIG. 8 depicts the enhancement factor of the critical current as a function of magnetic field and irradiation fluence.
Figure 9:
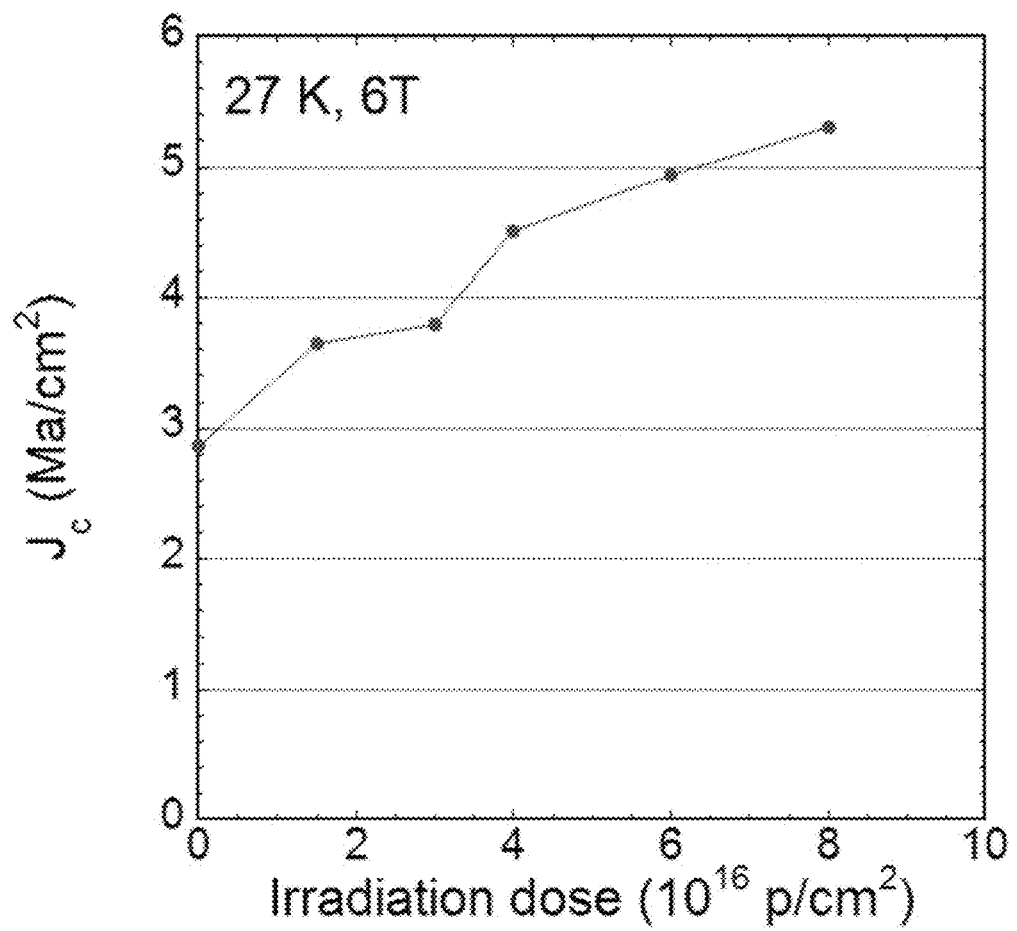
FIG. 9 depicts the relationship between critical current density and irradiation fluence.

As shown in FIG. 8, the beneficial effect of p-irradiation is larger in high fields. FIG. 9 depicts the evolution of critical current density $J_c$ with irradiation fluence in an applied field of 6 T along the c-axis at 27 K. The steady increase of $I_c$ with proton fluence in FIGS. 6-9 indicates that further enhancements of $I_c$ may be achieved with an even higher proton irradiation fluence. A maximum for $J_c$ may be achieved with fluences in the range of $15 \times 10^{16}$ p/cm² to $50 \times 10^{16}$ p/cm² for 27 K operation. This result is in contrast to single crystals of YBCO for which, depending on the measurement temperature, irradiation fluences of $1 \times 10^{16}$ p/cm² to $5 \times 10^{16}$ p/cm² were found to produce a maximum enhancement of $I_c$.

Figure 10:
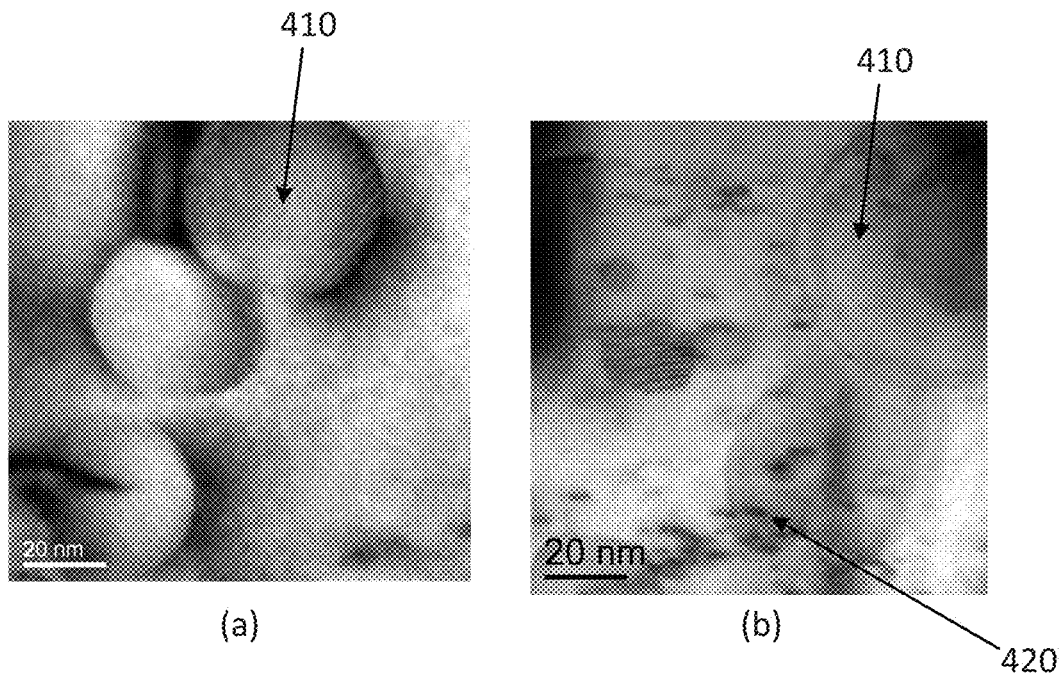
FIGS. 10 (a) and 10(b) are diffraction contrast TEM images of pristine and irradiated samples, respectively, for the diffraction vectors (200).
Figure 11:
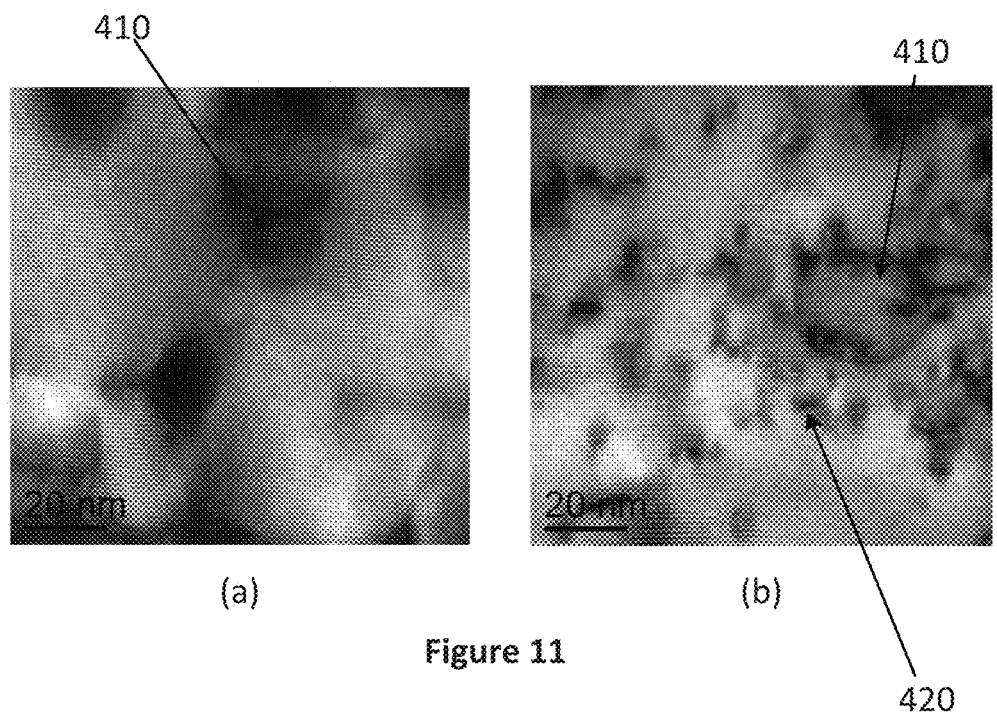
FIGS. 11(a) and 11(b) are diffraction contrast TEM images of pristine and irradiated samples, respectively, for the diffraction vectors (002).

FIGS. 10(a) and 10(b) are TEM images of a non-irradiated sample and a sample subjected to an irradiation fluence of $2 \times 10^{16}$ p/cm² with scattering vector (200), respectively. FIGS. 11(a) and 11(b) are TEM images of a non-irradiated sample and a sample subjected to an irradiation fluence of $2 \times 10^{16}$ p/cm² with scattering vector (002), respectively. In FIGS. 11(a) and 11(b), the c-axis lattice spacing of YBCO is clearly visible. The pre-existing defect structure of the sample is characterized by rare-earth oxide precipitates several tens of nanometers in diameter 410. Twin boundaries, which are also a common defect in this type of material, are not visible under the imaging conditions in FIGS. 10 and 11; however, it has been observed that the precipitates tend to congregate on twin boundaries. Proton-irradiation creates a large number of small randomly dispersed defects 420 with an average diameter of 2-5 nm, as shown in FIGS. 10(b) and 11(b). The different appearance of the randomly dispersed defects under different imaging conditions indicates that the defects have an anisotropic shape, most likely a plate-like geometry. The randomly dispersed defects are reproducibly observed in all imaged sections of the irradiated sample, and are consistent with similar findings on YBCO single crystals.

A precise knowledge of the local thickness of the sample is required to establish the defect density of the irradiate samples. However, an order of magnitude estimate may be obtained from previous results on single crystals which yielded a concentration of $\sim 2 \times 10^{16}$ cm$^{-3}$ following irradiation with 3.5 MeV protons to a fluence of $2 \times 10^{16}$ p/cm². The defect formation may strongly depend on the pre-existing microstructure, which is very complex for coated conductors.

The images in FIGS. 10 and 11 correlate to a model of a mixed pinning landscape composed of large, strong pin-sites in the form of rare-earth oxide precipitates and possibly twin boundaries in addition to a large number of weak, small irradiation-induced defects. For the reference sample at low fields, all vortices are strongly pinned and $I_c$ is approximately field-independent. With increasing field, $I_c$ is expected to initially vary approximately as $B^{-1/2}$ and, when interstitial vortices appear, as $B^{-1}$. The experimental data roughly follows this trend, although α does not reach the value of −1. The low-field critical current does not significantly increase upon p-irradiation because all vortices are already strongly pinned at low field. However, with increasing field, the randomly dispersed irradiation induced defects effectively pin interstitial vortices, yielding the observed enhancement of $I_c$ in high magnetic fields.

Figure 12:
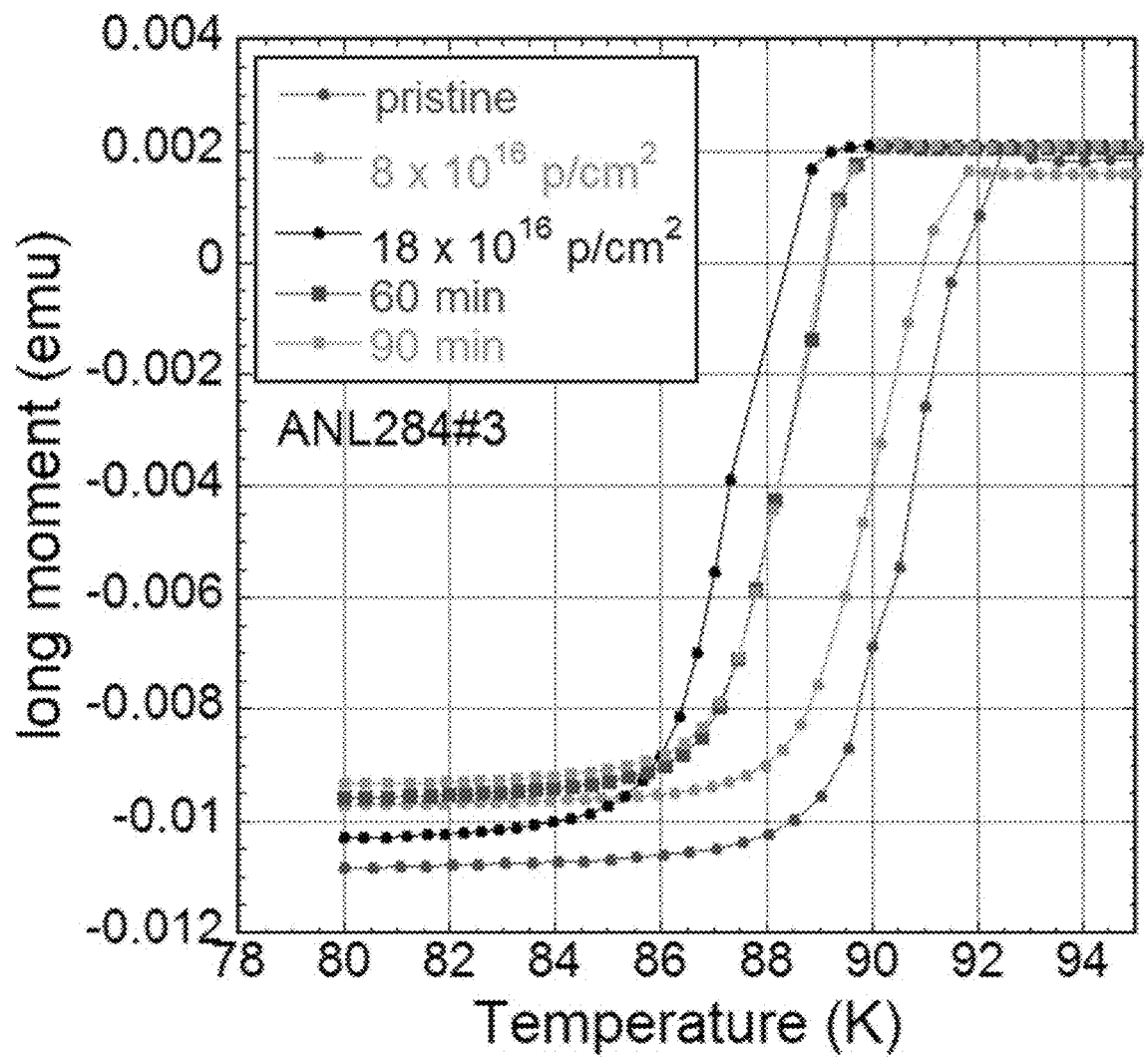
FIG. 12 depicts the long moment as a function of temperature.
Figure 13:
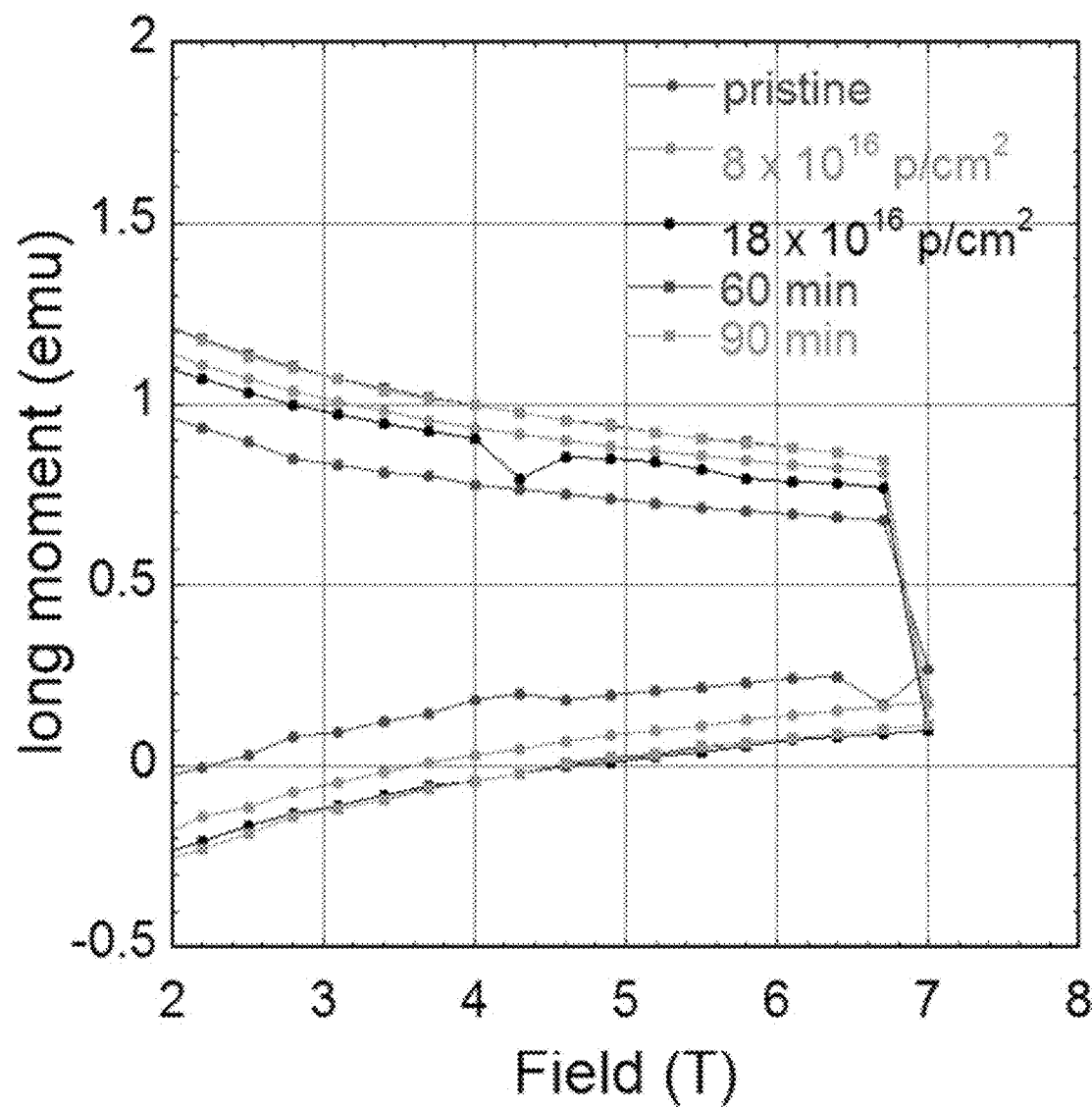
FIG. 13 depicts the long moment as a function of magnetic field.

FIGS. 12 and 13 depict the stability of the irradiation induced defects after annealing at 100° C. in air for 60 and 90 minutes. The sample subjected to an irradiation fluence of $18 \times 10^{16}$ p/cm² was the annealed sample. As shown in FIGS. 12 and 13, the randomly dispersed defects are stable and annealing produced an improvement in the $T_c$/MH loop.

Figure 14:
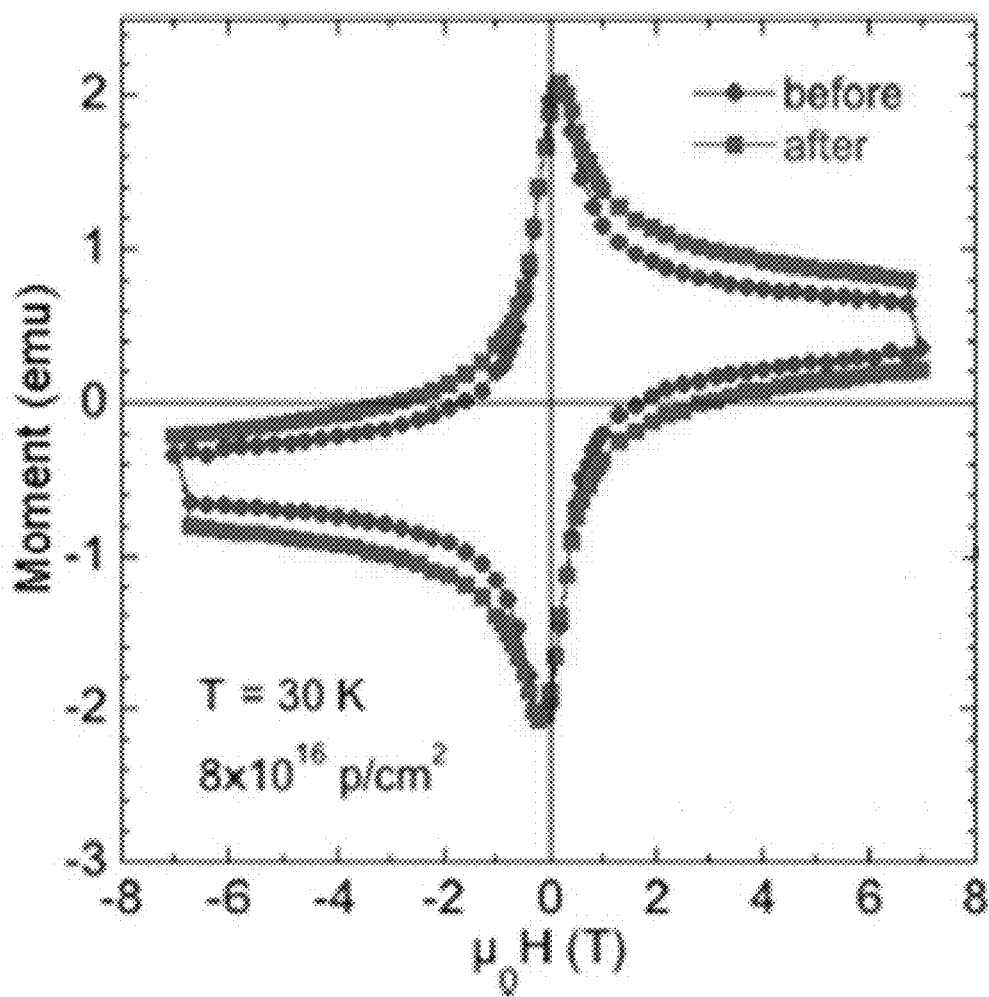
FIG. 14 depicts the relationship between magnetic moment and magnetic field.

FIG. 14 depicts the magnetization hysteresis at 30 K of a sample before and after irradiation to a fluence of $8 \times 10^{16}$ p/cm². The asymmetry of the magnetization hysteresis loop with respect to the field axis is a consequence of the RABiTS-type substrate.

Figure 15:
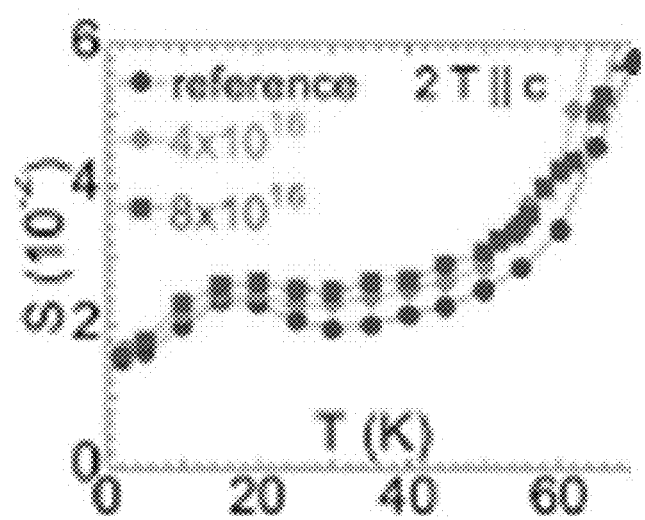
FIG. 15 shows the logarithmic relaxation rate of the magnetization as a function of temperature.

FIG. 15 shows the temperature dependence of the normalized logarithmic flux creep rate, $S = d\ln(M)/d\ln(t)$, at a field of 2 T along the c-axis for various irradiation fluences, where M is the magnetization. The initial increase of S(T) corresponds to an Anderson-Kim like creep with $S \approx T/U$, where U is the activation energy (approximately T-independent at low T), except that the non-zero extrapolation to S(T=0) is usually attributed to a quantum creep component. The non-irradiated reference sample shows a peak in S(T) with a maximum at T~15-20 K. This peak is characteristic of YBCO samples with disorder correlated along the c-axis, such as columnar or planar defects and presumably twin boundaries in the MOD produced films, and is a result of expansion of vortex double-kinks. The temperature range where S is approximately constant has been identified as characteristic fingerprint of glassy relaxation, with values around S~0.02-0.03 being characteristic of collective creep of vortex bundles.

The data shows a small but clear increase in S(T) as a function of irradiation fluence, indicating sensitivity of the relaxation dynamics to the pinning landscape. Non-irradiated metal-organic deposition (MOD) produced YBCO films have a lower S, particularly in the intermediate temperature plateau, than other YBCO samples, such as single crystals and films grown by pulsed laser deposition (PLD), an effect attributed to the larger pinning energy of the oxide precipitates. The increase in S(T) upon irradiation may be explained by the assumption that in the non-irradiated samples pinning at intermediate temperatures and fields in the range of a few Tesla is mostly due to the oxide precipitates while irradiation adds point and small cluster defects with a smaller characteristic glassy exponent μ and hence a higher plateau $S(T) \sim 1/\mu$. The increase in S is also consistent with the decrease in the n-value based on the approximate relation $S \sim 1/(n-1)$, valid when the broadening of the E-I curves is mainly due to flux creep.

Figure 16:
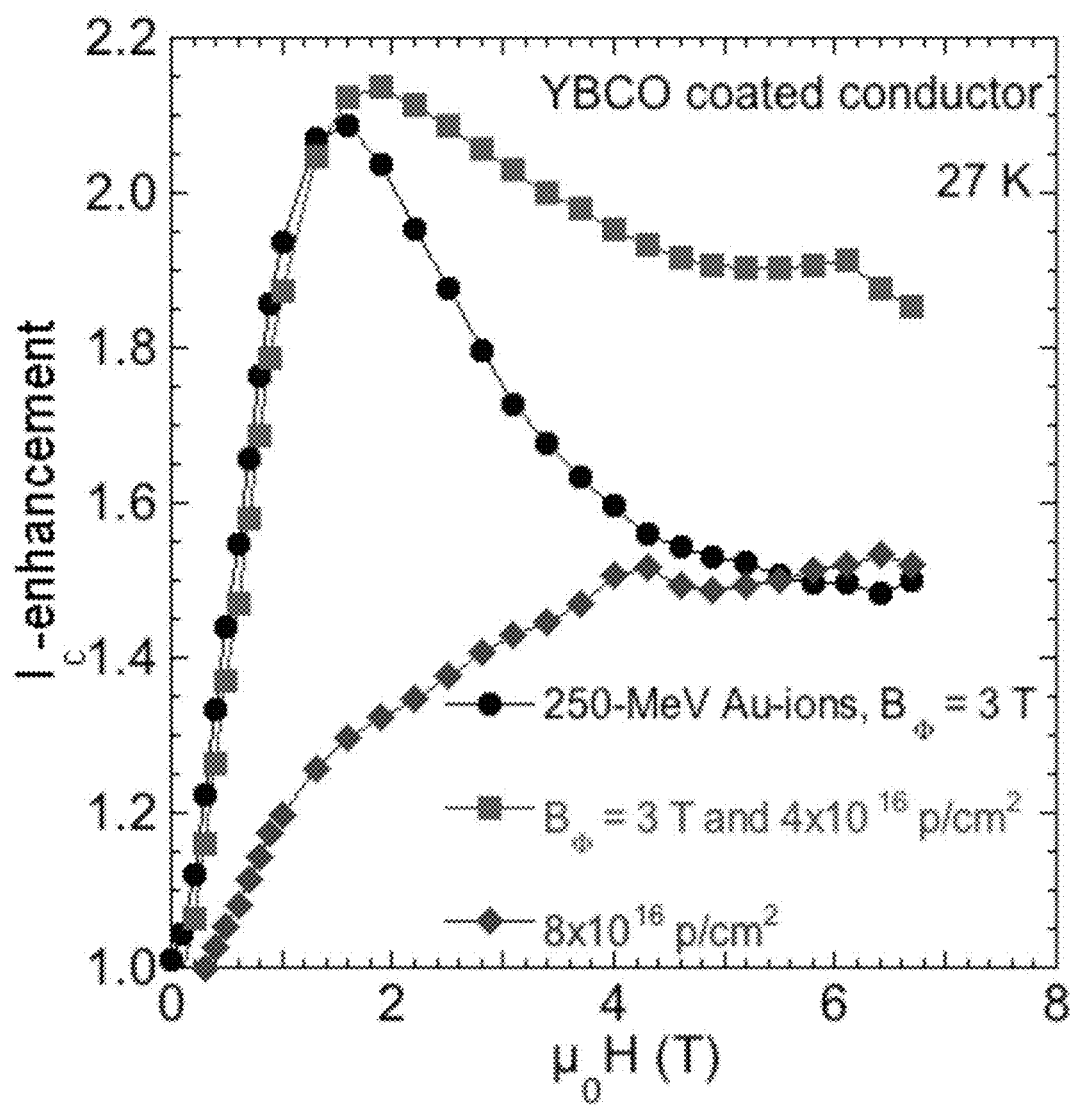
FIG. 16 depicts the enhancement effect of various irradiation protocols on critical current as a function of field strength.

While parameter values such as the optimum irradiation dose may depend on the specifics of the superconducting sample, such as its pre-existing defect structure, the beneficial effect of the small finely dispersed defects on vortex pinning in high magnetic fields is a generic feature of the structure of the randomly dispersed defect, and is embodied in the decrease of the exponent α with increasing concentration of the defects. These benefits are realized as soon as the randomly dispersed defects are introduced into the coated conductor, independent of both the means of their creation and the pre-existing microstructure of the superconductor. FIG. 16 shows the effect of various irradiation protocols on the critical current. Irradiation with 250-MeV Au-ions to a fluence of Bφ=3 T (corresponding to $1.5 \times 10^{11}$ ions/cm²) produced linear defects in the form of columns oriented along the direction of irradiation. The pinning effect of these columnar defects is most pronounced at low/intermediate fields. The randomly dispersed defects produced by subsequent irradiation with 4 MeV protons to a fluence of $4 \times 10^{16}$ p/cm² increased critical current in high fields similarly to the increase observed when the sample is irradiated with only 4 MeV protons to a fluence of $8\times10^{16}$ p/cm$^2$. Thus, the beneficial effect of the randomly dispersed defects arises independently of the presence of other defects. As shown in FIG. 16, the mixed pinning landscape that includes a combination of both types of defects increases the critical current over the entirety of the field range, by approximately a factor of two.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A method, comprising:
   irradiating a polycrystalline rare earth metal-alkaline earth metal-transition metal-oxide superconductor layer comprising at least one selected from the group consisting of metal oxide precipitates, columnar defects, and stacking faults with protons having an energy of 1 to 6 MeV, such that the irradiated layer comprises uniformly distributed randomly dispersed defects with an average diameter in the range of 1-10 nm and the at least one selected from the group consisting of metal oxide precipitates, columnar defects, and stacking faults.

2. The method of claim 1, wherein the rare earth metal-alkaline earth metal-transition metal-oxide superconductor layer comprises a material with the general formula:

$$(RE)Ba_2Cu_3O_7$$

where RE is at least one rare earth metal.

3. The method of claim 2, wherein RE comprises Yttrium.

4. The method of claim 1, wherein the irradiation has a fluence of at least $1.5\times10^{16}$ p/cm$^2$.

5. The method of claim 1, further comprising maintaining the layer at a temperature of less than 200° C. throughout the irradiation.

6. The method of claim 1, further comprising cooling the layer during the irradiation.

7. The method of claim 1, wherein the layer is disposed over a textured substrate.

8. The method of claim 1, wherein the irradiated layer exhibits a superconducting critical current density measured in a c-axis applied magnetic field of at least 1.5 T at a temperature of 27 K at least 10% greater than a reference material of the same chemical composition that does not include the randomly dispersed defects.

9. The method of claim 1, wherein a metallic protective layer is disposed over the polycrystalline rare earth metal-alkaline earth metal-transition metal-oxide superconductor layer, and irradiating the polycrystalline rare earth metal-alkaline earth metal-transition metal-oxide superconductor layer comprises passing the protons through the metallic protective layer.

* * * * *